United States Patent
Fiederling et al.

(10) Patent No.: US 9,453,638 B2
(45) Date of Patent: Sep. 27, 2016

(54) SEMICONDUCTOR LIGHT-EMITTING MODULE AND VEHICLE LUMINAIRE

(75) Inventors: Roland Fiederling, Friedberg (DE); Peter Frey, Heidenheim (DE); Harald Kaps, Zusmarshausen (DE); Jenny Trommer, Oberkochen (DE)

(73) Assignee: OSRAM GMBH, Munich (DE)

( * ) Notice: Subject to any disclaimer, the term of this patent is extended or adjusted under 35 U.S.C. 154(b) by 28 days.

(21) Appl. No.: 13/985,911

(22) PCT Filed: Feb. 20, 2012

(86) PCT No.: PCT/EP2012/052870
§ 371 (c)(1),
(2), (4) Date: Aug. 16, 2013

(87) PCT Pub. No.: WO2012/113755
PCT Pub. Date: Aug. 30, 2012

(65) Prior Publication Data
US 2015/0009702 A1     Jan. 8, 2015

(30) Foreign Application Priority Data

Feb. 25, 2011   (DE) .................. 10 2011 004 746

(51) Int. Cl.
*F21V 29/00* (2015.01)
*F21S 8/10* (2006.01)
(Continued)

(52) U.S. Cl.
CPC .............. *F21V 29/22* (2013.01); *F21S 48/115* (2013.01); *F21S 48/1145* (2013.01); *F21S 48/215* (2013.01); *F21S 48/321* (2013.01); *F21S 48/325* (2013.01); *F21S 48/326* (2013.01); *F21S 48/34* (2013.01); *F21V 21/00* (2013.01); *F21V 23/006* (2013.01); *F21V 23/008* (2013.01); *F21V 29/02* (2013.01); *F21V 29/70* (2015.01); *F21V 29/763* (2015.01); *F21V 29/90* (2015.01);
(Continued)

(58) Field of Classification Search
CPC .......... F21K 9/00; F21V 29/02; F21V 29/74; F21V 29/89; F21V 29/677; F21S 48/325; F21S 48/321
See application file for complete search history.

(56) References Cited

U.S. PATENT DOCUMENTS

| 2007/0035957 A1* | 2/2007 | Albou et al. ................. 362/487 |
| 2007/0201232 A1* | 8/2007 | Chen ..................... F21V 29/004 362/294 |

(Continued)

FOREIGN PATENT DOCUMENTS

| DE | 202010002406 U1 | 5/2010 |
| EP | 1643188 A1 | 4/2006 |

(Continued)

OTHER PUBLICATIONS

International Search Report for PCT/EP2012/052870; dated May 10, 2012; 5 pages.

*Primary Examiner* — Andrew Coughlin

(57) ABSTRACT

A semiconductor light-emitting module includes a housing, at least one cooling body accommodated in the housing wherein the cooling body is thermally connected to at least one semiconductor light source, an active cooling device accommodated in the housing, and at least one electronics unit accommodated in the housing, at least for actuating the at least one semiconductor light source, wherein the housing has a leadthrough opening, and the at least one semiconductor light source is arranged in the region of the leadthrough opening.

12 Claims, 4 Drawing Sheets

(51) Int. Cl.

| | | |
|---|---|---|
| *F21V 23/00* | (2015.01) | |
| *F21V 29/02* | (2006.01) | |
| *H05K 1/02* | (2006.01) | |
| *F21V 21/00* | (2006.01) | |
| *F21V 29/70* | (2015.01) | |
| *F21V 29/76* | (2015.01) | |
| *F21V 29/90* | (2015.01) | |
| *F21S 2/00* | (2016.01) | |
| *F21Y 101/02* | (2006.01) | |
| *F21Y 105/00* | (2016.01) | |
| *F21V 29/67* | (2015.01) | |

(52) U.S. Cl.
CPC ............ *H05K 1/0203* (2013.01); *F21S 2/005* (2013.01); *F21V 29/677* (2015.01); *F21Y 2101/02* (2013.01); *F21Y 2105/00* (2013.01); *F21Y 2105/008* (2013.01); *H05K 2201/10106* (2013.01)

(56) References Cited

U.S. PATENT DOCUMENTS

| | | |
|---|---|---|
| 2010/0027270 A1 | 2/2010 | Huang et al. |
| 2010/0091486 A1 | 4/2010 | Wu |
| 2010/0253223 A1 | 10/2010 | Inoue et al. |

FOREIGN PATENT DOCUMENTS

| | | |
|---|---|---|
| JP | 2008177020 A | 7/2008 |
| WO | 2005116520 A1 | 12/2005 |

\* cited by examiner

SEMICONDUCTOR LIGHT-EMITTING MODULE AND VEHICLE LUMINAIRE

RELATED APPLICATIONS

The present application is a national stage entry according to 35 U.S.C. §371 of PCT application No.: PCT/EP2012/052870 filed on Feb. 20, 2012, which claims priority from German application No.: 10 2011 004 746.8 filed on Feb. 25, 2011.

TECHNICAL FIELD

Various embodiments relate to a semiconductor light-emitting apparatus including a housing, at least one heat sink accommodated in the housing, wherein the heat sink is thermally connected to the at least one semiconductor light source, and an active cooling device accommodated in the housing. Various embodiments further relate to a vehicle luminaire having such a semiconductor light-emitting apparatus.

BACKGROUND

DE 10 2007 028 301 A1 discloses a vehicle headlamp having a housing and at least one semiconductor light source, which is arranged in the housing and is thermally connected to a cooling body by means of at least one heat pipe. In accordance with the disclosure, ventilation means for forced ventilation of the cooling body are provided. The cooling body can be arranged in the housing, in which case the ventilation means include a fan.

DE 10 2005 043 499 A1 discloses an external luminaire for motor vehicles which, in its installed position, is integrated in the vehicle body structure surrounding it, wherein the external luminaire has a luminaire housing which is closed on the light exit side by a transparent lens for accommodating the light-emitting means arrangement, the lens of said luminaire housing being formed integrally with an adjacent cladding part made from plastics. According to the disclosure, the surrounding vehicle contour of the lens is formed completely from the adjacent cladding part of the external luminaire, wherein the lens is formed, over its entire circumference, integrally with the cladding part, a ring-shaped reinforcing web protrudes from the inner side of the lens and is formed integrally with the lens, and the installed luminaire housing is tubular and is connected to the lens via the reinforcing web.

DE 10 2007 036 486 A1 discloses a headlamp system with at least one headlamp, whose interior is delimited at least regionally from the surrounding environment by means of at least one lens, with at least one light-emitting diode as light source and with at least one delivery apparatus arranged within the headlamp. For this purpose, the headlamp system includes a sensor system. The output signal from the sensor system is dependent on a characteristic value of the relative atmospheric humidity in the interior of the headlamp. In addition, the sensor system controls and/or regulates the delivery apparatus by means of the output signal.

SUMMARY

Various embodiments provide a particularly versatile, compact and easily coolable semiconductor light-emitting apparatus.

Various embodiments provide a semiconductor light-emitting module, having a housing, at least one heat sink (in particular cooling body) accommodated in the housing, wherein the heat sink is thermally connected to the at least one semiconductor light source, an active cooling device accommodated in the housing and at least one electronics unit accommodated in the housing at least for actuating the at least one semiconductor light source, wherein the housing has an opening (referred to below as "leadthrough opening"), and the at least one semiconductor light source is arranged in a region of the leadthrough opening.

A light-emitting module can be understood to mean in particular a light-generating unit which represents a separately mountable part of a luminaire or luminaire system. The light-emitting module may in particular be a separately producible unit. The light-emitting module can in particular be a replaceable part that can be replaced by an end user (for example vehicle owner), such as a lamp.

The electronics unit may in particular be a driver. The electronics unit may in particular be at least one printed circuit board with electrical and/or electronic components fitted thereon. The printed circuit board may in particular be a metal-core printed circuit board.

The fact that the at least one semiconductor light source is arranged in the region of the leadthrough opening includes both insertion of the at least one semiconductor light source into the leadthrough opening such that the at least one semiconductor light source is located at least partially still in or at the height of the leadthrough opening and passing it through such that the at least one semiconductor light source has been passed completely through the leadthrough opening.

The fact that the at least one semiconductor light source is arranged in the region of the leadthrough opening may further include the semiconductor light source being located completely in the interior enclosed by the housing. The leadthrough opening then serves to pass through light emitted by the at least one semiconductor source. The leadthrough opening may in this case be open or covered, for example by means of a transparent cover. The transparent cover may be an optical element, for example a lens, a diffuser, etc.

The semiconductor light-emitting module has the advantage that it is in principle use-independent and therefore is versatile. The cooling of the luminaire or the luminaire system is also simplified and furthermore made particularly effective owing to the self-coolable semiconductor light-emitting module in the case of installation in a luminaire or a luminaire system. In addition, a particularly compact and easy-to-fit light-emitting apparatus may be provided.

One configuration consists in that the active cooling device has at least one fan. The at least one fan enables a flow within the entire housing and also a simple and inexpensive design.

The at least one fan may preferably be mounted with vibration damping for interference-free operation and a long life.

A further configuration consists in that at least one dedicated heating source or heater is accommodated in the housing, with the result that, in the case of a cold ambient temperature, the semiconductor light-emitting module, in particular its interior, may be heated in a targeted manner. Thus, the electronics unit and/or the at least one semiconductor light source can be brought to the desired operating temperature more quickly. The at least one heating source may be operated in time-dependent fashion and/or in a fashion dependent on a measured temperature value, in particular may be activated and/or deactivated in this way. The air heated by the at least one heating source may in particular be directed onto the components to be heated by means of the fan and circulated in the housing (in particular when the housing is closed).

Alternatively, the active cooling device may include a coolant cycle, for example. This enables particularly effective cooling of selected components which are in thermal contact with the cooling device.

A further configuration consists in that at least one air guide element is accommodated in the housing. Thus, an air flow within the housing may be adjusted in a targeted manner for effective cooling of desired components or regions.

A development consists in that the air guide element is in the form of at least one tube, in which the fan is accommodated. The at least one tube enables particularly concentrated, directed and intense air flow. In particular, the at least one tube may be attached at one end to the housing, wherein the housing has at least one ventilation opening in the region laterally surrounded by the tube. As an alternative or in addition to the at least one tube, air guide plates etc. can be used.

A further development consists in that the heat sink has a cooling structure, in particular cooling ribs, cooling struts, cooling laminations and/or cooling pins.

A further configuration consists in that the housing is a substantially (apart from the leadthrough opening and possibly at least one cable channel or the like) closed housing. The closed housing is therefore in particular not designed in a targeted manner for the exchange of air with the surrounding environment for cooling the interior of the housing. Such a housing may be protected particularly well from the ingress of foreign substances (for example dirt particles or spray water) or gases. Therefore, it is particularly suitable for use in harsh environments, such as in a vehicle, aircraft, etc.

A further development consists in that the housing is provided with a pressure compensation means, for example with a sealing pressure compensation membrane.

In particular by means of a fan, the warm air located in the housing may be circulated or redistributed such that the housing is heated over a large area and correspondingly can emit heat to the outside over a large area. For good heat emission, the housing preferably consists of a material with a good thermal conductivity $\lambda$ of preferably more than 15 W/(m·K), for example of aluminum.

An alternative configuration consists in that the housing has at least one ventilation opening. This enables air exchange with the surrounding environment and thus particularly efficient cooling of the components present in the housing, in particular in the case of the presence of a fan as the active cooling device. In particular in this case, the housing may also consist of an inexpensive plastic.

The at least one ventilation opening may have at least one ventilation hole, at least one ventilation slot, etc.

A special configuration consists in that the housing has a plurality of ventilation openings, of which at least some are arranged in the vicinity of the electronics unit. Thus, a comparatively strong draft may be produced at the electronics unit for effective cooling thereof. In particular, the electronics unit, (in particular the printed circuit board thereof) may have air passage openings, which are arranged in such a way with respect to the plurality of ventilation openings in the housing arranged in the vicinity of the electronics unit (for example are congruent therewith) that a draft through the ventilation openings and the air passage openings is enabled, in particular in the case of an electronics unit resting on the housing.

In general, a development consists in that the housing envisages ventilation slots at least in a region which is not covered by the electronics unit, in particular the printed circuit board(s) thereof.

A further configuration consists in that at least one further fan is arranged on the electronics unit. This enables even more intense cooling of the electronics unit.

The electronics unit, in particular the printed circuit board thereof, can rest in particular on the housing, for example be adhesively bonded thereto. The electronics unit may in particular rest on the housing via a thermally conductive material such as a thermally conductive adhesive, a thermally conductive paste, a thermally conductive film, etc. As a result, heat transfer to the housing and in addition improved cooling of the electronics unit is enabled.

A further configuration consists in that the electronics unit, in particular the printed circuit board thereof, has a leadthrough opening, which is over the leadthrough opening of the housing, wherein the at least one semiconductor light source is arranged so as to be passed through the leadthrough opening. This enables a particularly compact design, in particular a design with a low height.

The leadthrough opening in the electronics unit and the leadthrough opening in the housing can have an identical diameter or different diameters. The leadthrough openings can also be arranged concentrically with respect to one another.

A further configuration consists in that the electronics unit is integrated in a wall of the housing. In other words, the electronics unit may represent a wall, in particular front side, of the housing. In particular, one side of the electronics unit, in particular the printed circuit board, which side is predominantly populated with electrical and/or electronic components, may represent an inner side of the housing, and the rear side of the electronics unit, in particular the printed circuit board, may represent an outer side. This enables a particularly compact, inexpensive apparatus requiring few component parts.

Yet a further configuration consists in that the leadthrough opening in the housing corresponds to the leadthrough opening in the electronics unit.

Yet a further configuration consists in that the electronics unit has at least one air passage opening. This enables particularly effective cooling, especially of the electronics unit.

In particular in this case, the heat sink may have a base-like projection, on which the at least one semiconductor light source is arranged and which is intended to be inserted into or passed through the leadthrough opening in the housing.

The heat sink may in particular have a plate-shaped region, from which the projection protrudes perpendicularly. The plate-shaped region may in particular be arranged parallel to and spaced apart from the electronics unit, in particular the printed circuit board thereof. The plate-shaped region may be recessed in particular laterally with respect to the electronics unit, in particular the printed circuit board thereof, with the result that a direct air flow from a rearwardly arranged fan onto the electronics unit is enabled.

In addition, a configuration consists in that the electronics unit is configured as a driver for actuating the at least one semiconductor light source and for actuating the cooling device, in particular in the form of a fan controller or fan regulator. This has the advantage that fewer component parts and cable connections are required than in the case of a separate design, which results in increased efficiency of the cooling device and the driver electronics unit. This may be achieved in particular by virtue of the fact that the actuation of the cooling device functions depending on the actuation of the at least one semiconductor light source, with the result that, for example, measurement, control and/or controlled variables of the actuation of the at least one semiconductor light source may act as input variables for the actuation of the cooling device.

Preferably, the at least one semiconductor light source includes at least one light-emitting diode. In the case of the provision of a plurality of light-emitting diodes, said light-emitting diodes may emit light in the same color or in different colors. A color may be monochromatic (for example red, green, blue, etc.) or multichromatic (for example white). The light emitted by the at least one light-emitting diode can also be an infrared light (IR-LED) or an ultraviolet light (UV-LED). A plurality of light-emitting diodes may generate a mixed light, for example a white mixed light. The at least one light-emitting diode may contain at least one wavelength conversion phosphor (conversion LED). The phosphor can alternatively or additionally be arranged at a distance from the light-emitting diode ("remote phosphor"). The at least one light-emitting diode may be present in the form of at least one individually housed light-emitting diode or in the form of at least one LED chip. A plurality of LED chips can be fitted on a common substrate ("submount"). The at least one light-emitting diode may be equipped with at least one dedicated and/or common optical element for beam guidance, for example at least one Fresnel lens, collimator, etc. Instead of or in addition to inorganic light-emitting diodes, for example on the basis of InGaN or AlInGaP, organic LEDs (OLEDs, for example polymer OLEDs) can generally also be used. Alternatively, the at least one semiconductor light source may have at least one diode laser, for example.

Various embodiments also provide a vehicle luminaire, having at least one semiconductor light-emitting module as described above.

A vehicle may be understood to mean any type of means of transportation such as a motor vehicle (passenger vehicle, heavy goods vehicle), a ship, an aircraft, a bicycle, a motorcycle, etc.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
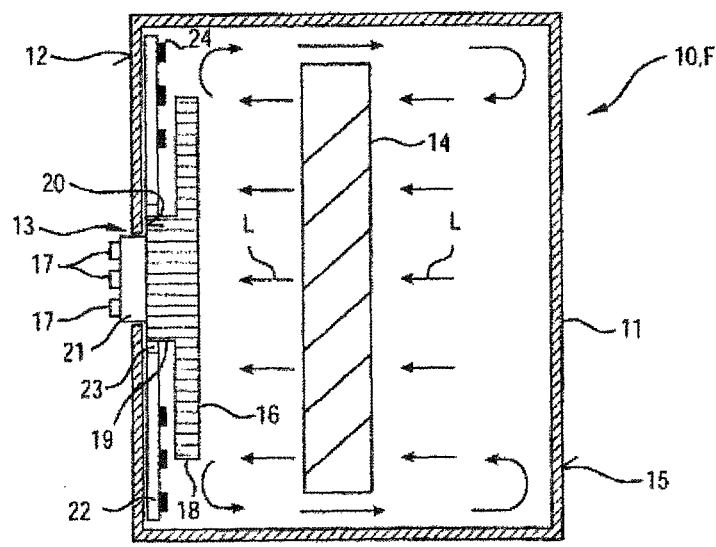
FIG. 1 shows a sectional illustration in a side view of a semiconductor light-emitting module in accordance with a first embodiment.

FIG. 1 shows a sectional illustration in a side view of a semiconductor light-emitting module 10 in accordance with a first embodiment, for example for installation in a vehicle luminaire F. The semiconductor light-emitting module 10 has a housing 11 consisting of steel or aluminum with a leadthrough opening 13 provided on a front side 12. An active cooling device in the form of a fan 14 is accommodated in the housing 11. The fan 14 is aligned in such a way that it sucks in air L from the direction of a rear side 15 of the housing 11 and blows out air L in the direction of the front side 12.

In this case, the fan 14 blows onto a heat sink in the form of a cooling body 16 accommodated in the housing 11. The cooling body 16 is thermally connected to a plurality of semiconductor light sources in the form of light-emitting diodes 17. The cooling body 16 consists of a material with good thermal conductivity, for example of aluminum. The waste heat generated by the light-emitting diodes 17 is therefore transmitted at least partially onto the cooling body 16 and dissipated.

The cooling body 16 in this case has a plate-shaped region 18, which is adjoined centrally by a projection 19. The light-emitting diodes 17 are fitted on a flat front side 20 of the projection 19, to be precise via a substrate or submount 21 common to the light-emitting diodes 17. The submount consists of, for example, a ceramic with good thermal conductivity. The projection 19 is dimensioned in such a way that it fits and is inserted into the leadthrough opening 13 with a tight fit or with only a small amount of play. The light-emitting diodes 17 are therefore located outside the housing 11 and do not radiate their light into or through the housing 11, as a result of which light losses may be avoided.

In addition, an electronics unit 22, which has a printed circuit board with electrical and/or electronic component parts fitted thereon, is accommodated in the housing 11. The electronics unit 22 is used both for actuating the light-emitting diodes 17 and the fan 14. The electronics unit 22 can be connected to an external voltage and/or current source (ballast, mains connection, etc.) via electrical lines (not shown). The electrical lines may be passed through the housing 11.

The electronics unit 22 has a central leadthrough opening 23, which is over the leadthrough opening 13 of the housing, wherein light-emitting diodes 17 are also arranged so as to be passed through the leadthrough opening 23 or the projection 19 protrudes through the leadthrough opening 23.

The electronics unit 22 protrudes laterally outwards via the cooling body 16, with the result that the electronics unit 22 is at least peripherally in the air flow of the fan 14 and may be cooled thereby.

During operation of the light-emitting apparatus 10, the light-emitting diodes 17 are activated and emit light into a half space remote from the housing 11. In the process, said light-emitting diodes generate waste heat, which is transferred to the cooling body 16 via the submount 21 and distributed there. In addition, the electrical and/or electronic component parts 24 of the electronics unit 22 generate waste heat. In the case of an activated fan 14, said fan blows onto the cooling body 16 and the electronics unit 22, with the result that a circulating air flow is generated in the housing 11, which air flow absorbs the waste heat from the cooling body 16 and the electronics unit 22 and distributes it in the housing 11. As a result, the housing 11 is heated over a large area and can itself act as cooling body. As a result, the air in the housing 11 is cooled. The housing 11 may have at least one cooling structure (see figure), for example cooling ribs, cooling laminations, cooling pins, etc., on the outside.

Figure 2:
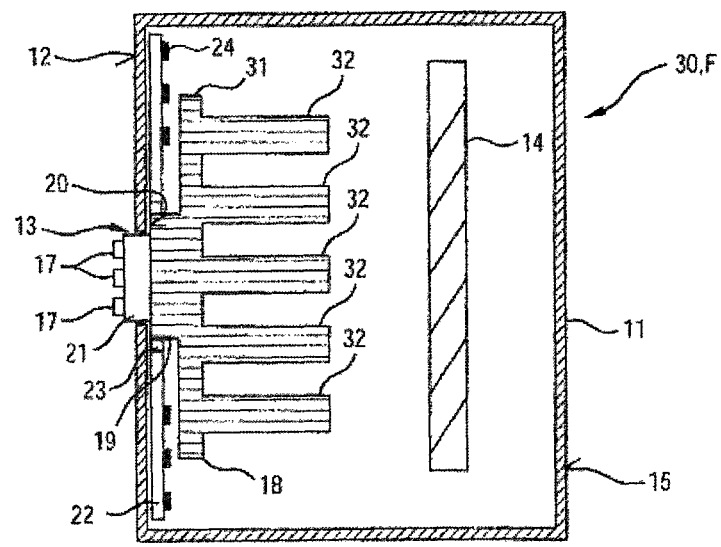
FIG. 2 shows a sectional illustration in a side view of a semiconductor light-emitting module in accordance with a second embodiment.

FIG. 2 shows a sectional illustration in a side view of a semiconductor light-emitting module 30 in accordance with a second embodiment. The semiconductor light-emitting module 30 differs from the semiconductor light-emitting module 10 in that the cooling body 31 now has a cooling structure facing the fan 14 in the form of a plurality of cooling ribs 32, which protrude from the plate-shaped region 18 perpendicularly. As a result, a heat transfer from the cooling body 31 to the air surrounding it is intensified.

Figure 3:
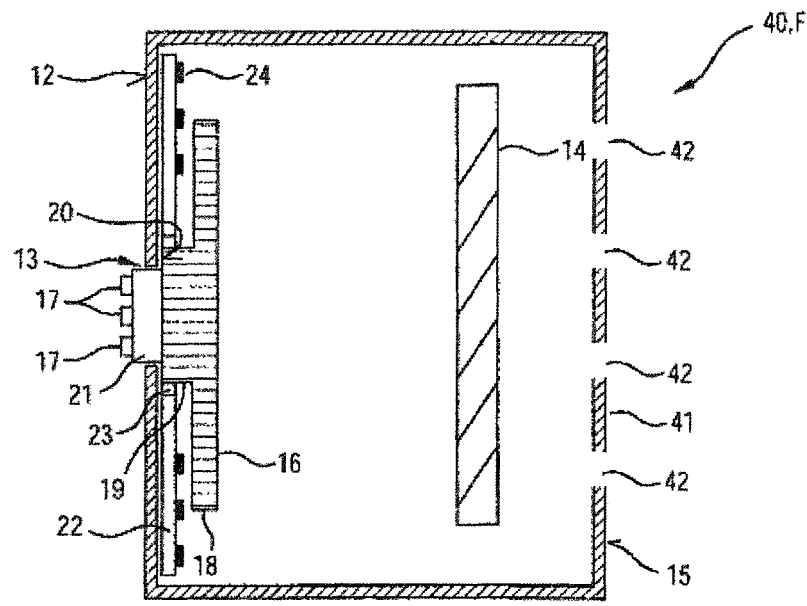
FIG. 3 shows a sectional illustration in a side view of a semiconductor light-emitting module in accordance with a third embodiment.

FIG. 3 shows a sectional illustration in a side view of a semiconductor light-emitting module 40 in accordance with a third embodiment. The semiconductor light-emitting module 40 differs from the semiconductor light-emitting module 10 in that the rear side 15 of the housing 41 now has, areally distributed, a plurality of ventilation openings 42. The ventilation openings 42 enable in particular forced air exchange with the surrounding environment and therefore intensified cooling of the air located in the housing 11. The housing 41 can in this case consist of plastics as well.

Figure 4:
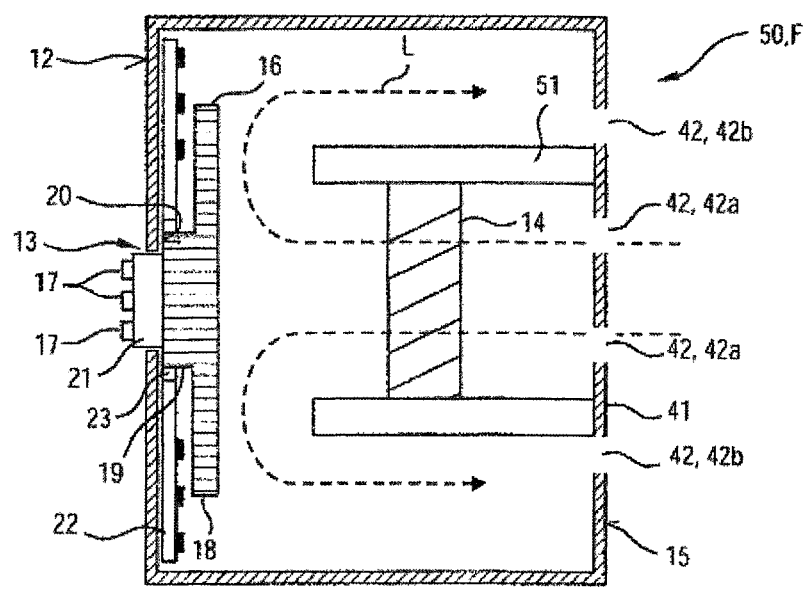
FIG. 4 shows a sectional illustration in a side view of a semiconductor light-emitting module in accordance with a fourth embodiment.

FIG. 4 shows a sectional illustration in a side view of a semiconductor light-emitting module 50 in accordance with a fourth embodiment. The semiconductor light-emitting module 50 differs from the semiconductor light-emitting module 40 in that, in addition, an air guide element 51 in the form of a tube 51 is provided in the housing 41. The fan 14 is located in the tube 51. As a result, an air flow in the housing 41 can be channeled and consequently intensified and directed more precisely. In this case, the tube 51 rests with one end on the rear wall 15, as a result of which some ventilation openings 42a of the ventilation openings 42 located in the rear wall 15 are surrounded by said tube and other ventilation openings 42b of the ventilation openings 42 located in the rear wall 15 are arranged laterally outside the tube 51.

During operation of the fan 14, air L is sucked into the tube 51 through the ventilation openings 42a by means of the fan 14 and blown out at the other end, to be precise onto the cooling body 16. The cooling body is thus subjected to a relatively intense air flow which cools it more effectively. The air can pass out of the ventilation openings 42b. An air flow within the housing 41 is facilitated and intensified by the tube 51, which improves cooling.

Figure 5:
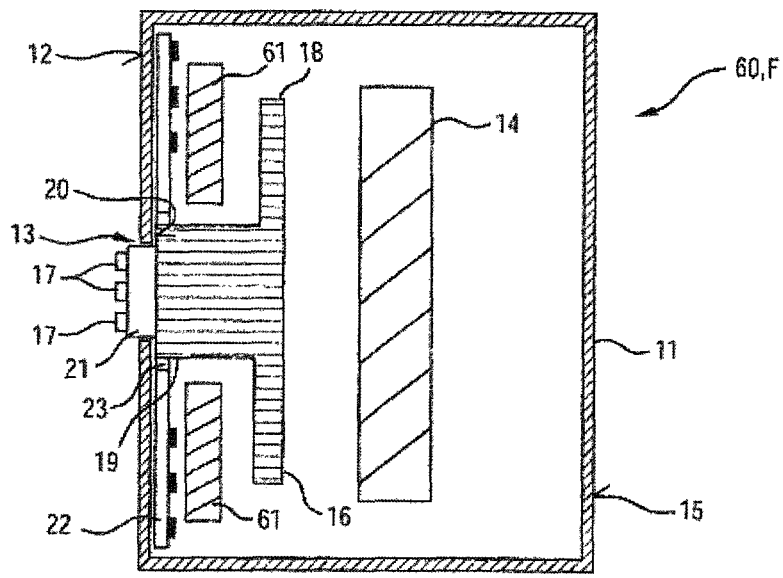
FIG. 5 shows a sectional illustration in a side view of a semiconductor light-emitting module in accordance with a fifth embodiment.

FIG. 5 shows a sectional illustration in a side view of a semiconductor light-emitting module 60 in accordance with a fifth embodiment. The semiconductor light-emitting module 60 differs from the semiconductor light-emitting module 10 in that further fans 61 are arranged on the electronics unit 22 on the side facing the rear side 15. Said fans enable an intensified air flow via the electronics unit 22 and therefore improved cooling thereof. These fans 61 can also be actuated by means of the electronics unit 22. The projection 19 is configured so as to be correspondingly high so as to also cover the fans 61 at a distance.

Figure 6:
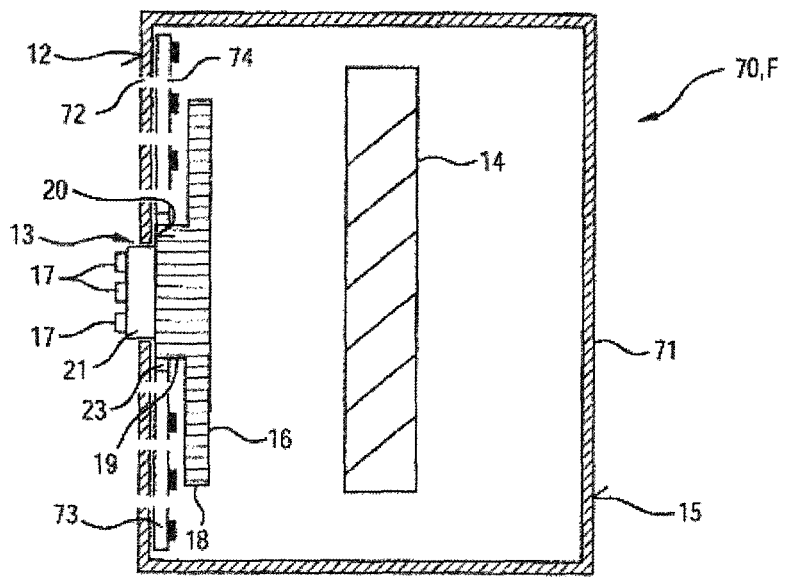
FIG. 6 shows a sectional illustration in a side view of a semiconductor light-emitting module in accordance with a sixth embodiment.

FIG. 6 shows a sectional illustration in a side view of a semiconductor light-emitting module 70 in accordance with a sixth embodiment.

The semiconductor light-emitting module 70 differs from the semiconductor light-emitting module 10 in that the housing 71 has a plurality of ventilation openings 72 in its front side 12, said ventilation openings consequently being arranged in the vicinity of the electronics unit 73. The electronics unit 73, in particular the printed circuit board thereof, has air passage openings 74, which are at least substantially congruent with the ventilation openings 72, with the result that air can flow through adjoining ventilation openings 72 and air passage openings 74. This improves cooling of the electronics unit 73 further and enables increased air flow through the housing 71 and therefore also improved cooling of the cooling body 16 (and consequently of the light-emitting diodes 17).

Figure 7:
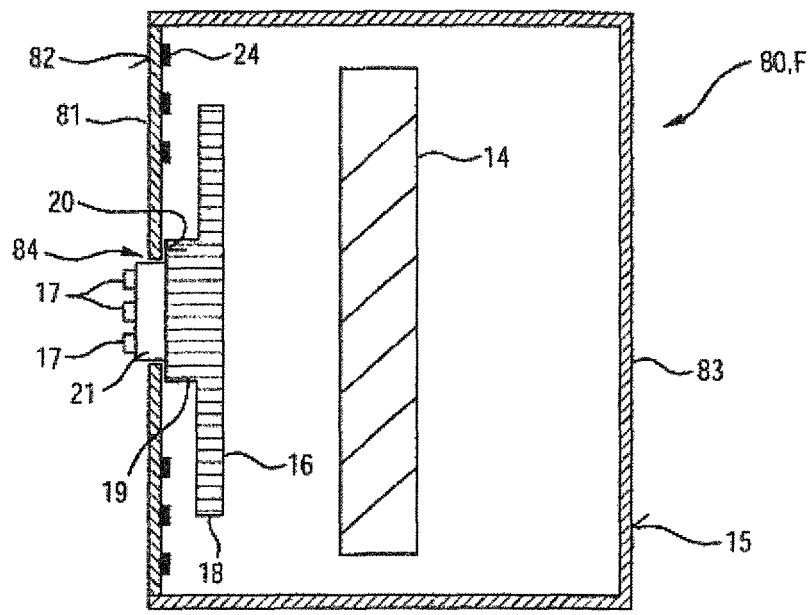
FIG. 7 shows a sectional illustration in a side view of a semiconductor light-emitting module in accordance with a seventh embodiment.

FIG. 7 shows a sectional illustration in a side view of a semiconductor light-emitting module 80 in accordance with a seventh embodiment. The semiconductor light-emitting module 80 differs from the semiconductor light-emitting module 10 in that the electronics unit 81 is integrated in the front side 82 of the housing 83. In other words, the front side 82 of the housing 83 is formed by means of the electronics unit 81, which terminates tightly with the rest of the housing 83. The leadthrough opening 84 in the housing 83 therefore corresponds to the leadthrough opening in the electronics unit 81. Such a configuration is particularly compact and requires few component parts. In particular, one side which is populated at least predominantly with the electrical and/or electronic component parts 24 can be directed into the housing 83 and as a result can represent an inner side of the housing 83. This protects the electrical and/or electronic component parts 24.

The semiconductor light-emitting module 80 can in particular be configured in a similar way to the developments shown in FIGS. 2 to 6, for example with at least one additional fan 61 and/or with air passage openings 74 in the electronics unit 81, in particular the printed circuit board thereof.

Figure 8:
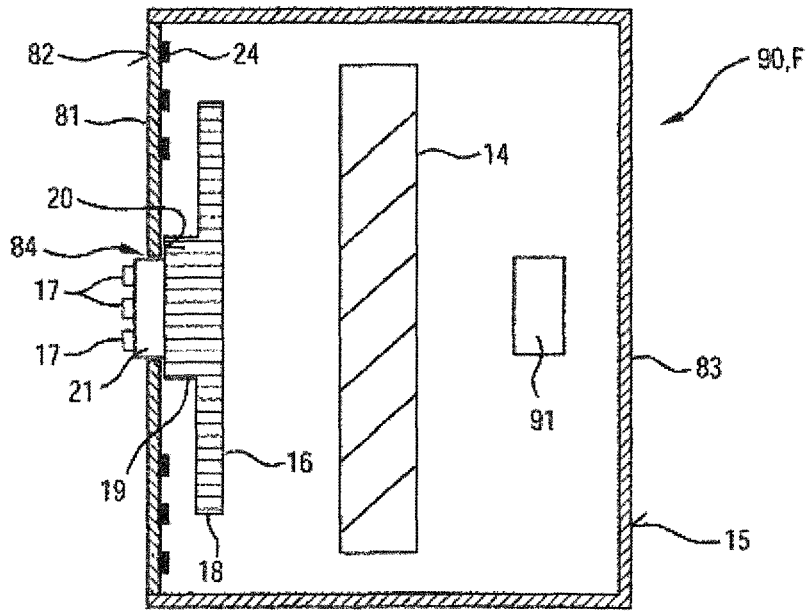
FIG. 8 shows a sectional illustration in a side view of a semiconductor light-emitting module in accordance with an eighth embodiment.

FIG. 8 shows a sectional illustration in a side view of a semiconductor light-emitting module 90 in accordance with an eighth embodiment. The semiconductor light-emitting module 90 has a dedicated heating source 91 in the interior surrounded by the housing 83. This heating source can be activated at the beginning of activation of the semiconductor light-emitting module 90 for example up to the point at which an operating temperature is reached. The heat from said heating source can be blown onto the cooling body 16 and the electronics unit 81 by means of the fan 14, for example.

The disclosure is of course not restricted to the embodiment shown.

Thus, in particular features of the different embodiments shown can be combined with one another or replaced by one another.

Thus, the at least one additional fan of the semiconductor light-emitting module 60 may be combined with the ventilation openings 72 and air passage openings 74 in the semiconductor light-emitting module 70. The tube 51 and the ventilation openings 42a in the semiconductor light-emitting module 50 may also be combined with the ventilation openings 72 and air passage openings 74 in the semiconductor light-emitting module 70. In addition, the cooling body 31 of the semiconductor light-emitting module 30 can be used in different semiconductor light-emitting modules 10, 40, 50, 60, 70, etc.

The term fan may in particular be understood to mean a fan with a rotatable rotor or impellor. A fan may, however, also be understood to mean any other apparatus which delivers air or another gas in a targeted manner, for example a piezoelectric cooler, a so-called jet impingement cooler, an ultrasound cooler, etc. The fans in particular serve the purpose of directing a gaseous cooling medium onto an area or component part to be cooled.

The inner wall of the housing may generally have a surface structure which promotes heat exchange with the surrounding environment (for example as a result of roughened portions).

The front side of the semiconductor light-emitting module may in particular itself be covered again.

The at least one semiconductor light source, in particular light-emitting diodes, may also be arranged within the housing, for example by means of a suitable recess in the front side 20 of the projection 19.

While the disclosed embodiments has been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SYMBOLS

10 Semiconductor light-emitting module
11 Housing
12 Front side
13 Leadthrough opening
14 Fan
15 Rear side
16 Cooling body
17 Light-emitting diodes
18 Plate-shaped region
19 Projection
20 Flat front side
21 Submount
22 Electronics unit
23 Leadthrough opening
24 Electrical and/or electronic component part
30 Semiconductor light-emitting module
31 Cooling body
32 Cooling ribs
40 Semiconductor light-emitting module
41 Housing
42 Ventilation opening
42a Ventilation opening
42b Ventilation opening
50 Semiconductor light-emitting module
51 Tube
60 Semiconductor light-emitting module
61 Fan
70 Semiconductor light-emitting module
71 housing
72 Ventilation opening
73 Electronics unit
74 Air passage opening
80 Semiconductor light-emitting module
81 Electronics unit
82 Front side of housing
83 Housing
84 Leadthrough opening in housing/electronics unit
90 Semiconductor light-emitting module
91 Heating source
F Vehicle luminaire
L Air

The invention claimed is:

1. A semiconductor light-emitting module, comprising:
a housing having a front side and a rear side,
at least one cooling body accommodated in the housing wherein the cooling body is thermally connected to a plurality of semiconductor light sources via a substrate or submount common to said semiconductor light sources,
an active cooling device in the form of a fan accommodated in the housing, and
at least one electronics unit accommodated in the housing for actuating the semiconductor light sources and the fan,
wherein the housing has a leadthrough opening provided on the front side, and the electronics unit has a leadthrough which overlaps with the leadthrough on the front side of the housing, and wherein said substrate or submount is arranged in the region of said leadthrough openings so that the semiconductor light sources protrude outside the housing.

2. The semiconductor light-emitting module as claimed in claim 1, wherein the active cooling device has at least one fan.

3. The semiconductor light-emitting module as claimed in claim 2, wherein at least one air guide element is accommodated in the housing.

4. The semiconductor light-emitting module as claimed in claim 1, wherein the housing is a sealed housing.

5. The semiconductor light-emitting module as claimed in claim 1, wherein the housing has at least one ventilation opening.

6. The semiconductor light-emitting module as claimed in claim 5, wherein the housing has a plurality of ventilation openings, of which at least some are arranged in the vicinity of the electronics unit.

7. The semiconductor light-emitting module as claimed in claim 1, wherein at least one further fan is arranged on the electronics unit.

8. The semiconductor light-emitting module as claimed in claim 1, wherein the electronics unit is integrated in a wall of the housing.

9. The semiconductor light-emitting module as claimed in claim 1, wherein the leadthrough opening in the housing corresponds to the leadthrough opening in the electronics unit.

10. The semiconductor light-emitting module as claimed in claim 1, wherein the electronics unit has at least one air passage opening.

11. The semiconductor light-emitting module as claimed in claim 1, wherein at least one heating source is accommodated in the housing.

12. A vehicle luminaire, having at least one semiconductor light-emitting module comprising:
a housing having a front side and a rear side,
at least one cooling body accommodated in the housing wherein the cooling body is thermally connected to a plurality of semiconductor light sources via a substrate or submount common to said semiconductor light sources, an active cooling device in the form of a fan accommodated in the housing, and at least one electronics unit accommodated in the housing for actuating the semiconductor light sources and the fan, wherein the housing has a leadthrough opening provided on the front side, and the electronics unit has a leadthrough which overlaps with the leadthrough on the front side of the housing, and wherein said substrate or submount is arranged in the region of said leadthrough openings so that the semiconductor light sources protrude outside the housing.

\* \* \* \* \*